(12) United States Patent
Xiang et al.

(10) Patent No.: US 7,306,997 B2
(45) Date of Patent: Dec. 11, 2007

(54) STRAINED FULLY DEPLETED SILICON ON INSULATOR SEMICONDUCTOR DEVICE AND MANUFACTURING METHOD THEREFOR

(75) Inventors: Qi Xiang, San Jose, CA (US); Niraj Subba, Sunnyvale, CA (US); Witold P. Maszara, Morgan Hill, CA (US); Zoran Krivokapic, Santa Clara, CA (US); Ming-Ren Lin, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 199 days.

(21) Appl. No.: 10/986,399

(22) Filed: Nov. 10, 2004

(65) Prior Publication Data

US 2006/0099752 A1 May 11, 2006

(51) Int. Cl.
*H01L 21/336* (2006.01)
(52) U.S. Cl. ............... 438/300; 438/938; 257/E21.619
(58) Field of Classification Search ............... 438/300, 438/938; 257/E21.562, E21.619
See application file for complete search history.

(56) References Cited

U.S. PATENT DOCUMENTS

| | | | |
|---|---|---|---|
| 5,986,287 | A | 11/1999 | Eberl et al. |
| 6,303,448 | B1 | 10/2001 | Chang et al. |
| 6,339,244 | B1 | 1/2002 | Krivokapic |
| 6,558,994 | B2 | 5/2003 | Cha et al. |
| 6,605,498 | B1 | 8/2003 | Murthy et al. |
| 6,621,131 | B2 * | 9/2003 | Murthy et al. ............... 257/408 |
| 6,649,480 | B2 | 11/2003 | Fitzgerald et al. |
| 6,660,598 | B2 | 12/2003 | Hanafi et al. |
| 6,680,240 | B1 | 1/2004 | Maszara |
| 6,902,991 | B2 | 6/2005 | Xiang et al. |
| 6,909,186 | B2 | 6/2005 | Chu |
| 6,936,875 | B2 | 8/2005 | Sugii et al. |
| 6,989,570 | B2 | 1/2006 | Skotnicki et al. |
| 6,995,430 | B2 | 2/2006 | Langdo et al. |

FOREIGN PATENT DOCUMENTS

WO WO 2004/049406 A1 6/2004

OTHER PUBLICATIONS

Jurczak et al., "Silicon-on-Nothing (SON)—an Innovative Process for Advanced CMOS", IEEE Transactions on Electron Devices, Nov. 2000, pp. 2179-2185, v. 2, No. 4.
Monfray et al, "Coulomb-Blockade in Nanometric Si-Film Silicon-On-Nothing (SON) MOSFETs", IEEE Transactions on Nanotechnology, Dec. 2003, pp. 295-300 v.2, No. 4.
T. Ghani, et al. "A 90nm High Volume Manufacturing Logic Technology Featuring Novel 45nm Gate Length Strained Silicon CMOS Transistors", IEDM Tech. Digest, p. 978, Dec. 9, 2003.

* cited by examiner

*Primary Examiner*—Chandra Chaudhari
(74) *Attorney, Agent, or Firm*—Mikio Ishimaru

(57) ABSTRACT

A semiconductor substrate is provided having an insulator thereon with a semiconductor layer on the insulator. A deep trench isolation is formed, introducing strain to the semiconductor layer. A gate dielectric and a gate are formed on the semiconductor layer. A spacer is formed around the gate, and the semiconductor layer and the insulator are removed outside the spacer. Recessed source/drain are formed outside the spacer.

8 Claims, 3 Drawing Sheets

STRAINED FULLY DEPLETED SILICON ON INSULATOR SEMICONDUCTOR DEVICE AND MANUFACTURING METHOD THEREFOR

TECHNICAL FIELD

The present invention relates generally to silicon-on-insulator semiconductor devices and more particularly to fully depleted silicon-on-insulator transistors.

BACKGROUND ART

At the present time, electronic products are used in almost every aspect of life, and the heart of these electronic products is the integrated circuit. Integrated circuits are used in everything from airplanes and televisions to wristwatches.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each wafer worth hundreds or thousands of dollars.

Integrated circuits are made up of hundreds to millions of individual components. One common component is the semiconductor transistor. The most common and important semiconductor technology presently used is silicon-based, and the most preferred silicon-based semiconductor device is a complementary metal oxide semiconductor ("CMOS") transistor.

The principal elements of a CMOS transistor generally consist of a silicon substrate having shallow trench oxide isolation regions cordoning off transistor areas. The transistor areas contain polysilicon gates on silicon oxide gates, or gate oxides, over the silicon substrate. The silicon substrate on both sides of the polysilicon gate is slightly doped to become conductive. These lightly doped regions of the silicon substrate are referred to as "shallow source/drain", which are separated by a channel region beneath the polysilicon gate. A curved silicon oxide or silicon nitride spacer, referred to as a "sidewall spacer", on the sides of the polysilicon gate allows deposition of additional doping to form more heavily doped regions of the shallow source/drain ("S/D"), which are called "deep S/D".

To complete the transistor, a silicon oxide dielectric layer is deposited to cover the polysilicon gate, the curved spacer, and the silicon substrate. To provide electrical connections for the transistor, openings are etched in the silicon oxide dielectric layer to the polysilicon gate and the S/D. The openings are filled with metal to form electrical contacts. To complete the integrated circuits, the contacts are connected to additional levels of wiring in additional levels of dielectric material to the outside of the dielectric material.

One improvement to the CMOS transistor uses an insulating substrate and is called silicon on insulator ("SOI"). The advantages of using an insulating substrate in CMOS and high speed field effect transistors ("FETs") include latchup immunity, radiation hardness, reduced parasitic junction capacitance, reduced junction leakage currents, and reduced short channel effects. Many of these advantages translate to increased speed performance of the FETs.

The SOI FETs are manufactured with an insulator, such as silicon dioxide, on a semiconductor substrate, such as silicon. The entire FETs, including their source junction, channel, drain junction, gate, ohmic contacts and wiring channels, are formed on silicon islands in the insulator and are insulated from any fixed potential. This results in what is called the "floating body" problem because the potential of the body or channel regions floats and can acquire a potential which can interfere with the proper functioning of the FETs. The floating body problem causes high leakage current and parasitic bipolar action since the semiconductor substrate is floating with respect to the channel. This problem has adverse affects on threshold voltage control and circuit operation.

In order to eliminate the floating body problem, it is necessary to fully deplete the silicon island. This means making the silicon island so thin that the entire thickness of the body region is depleted of majority carriers when the FET is in the off state and both junctions are at ground. To fully deplete the silicon island and create a fully depleted silicon on insulator ("FDSOI"), it has been found that the silicon island must be extremely thin.

However, having a thin silicon island causes problems in the fabrication of FDSOI CMOS in the formation of source and drain with low parasitic series resistance. One solution is to elevate the source and drain over the thin silicon island. Elevated source and drain are formed by selective epitaxial growth ("SEG"). Unfortunately, it is difficult to uniformly grow high quality, single crystalline source and drain on the extremely thin silicon island. Furthermore, processes performed prior to SEG, such as oxidation, pre-clean, and $H_2$ baking, can remove all or parts of the thin silicon needed for SEG.

Another key issue for fabrication of FDSOI CMOS is mechanisms to improve performance. One way to improve performance is to introduce tensile strain or compressive strain to the channel. Tensile strain along the direction of current flow increases both electron and hole mobility. On the other hand, compressive strain increases hole mobility but degrades electron mobility. Strain is introduced to the channel through trench isolation fill. However, mesa isolation, where there is no trench etch and fill, is conventionally used for FDSOI CMOS.

What is needed, therefore, is a way to uniformly grow high quality, single crystalline source and drain while introducing strain to the channel.

Solutions to these problems have been long sought but prior developments have not taught or suggested any solutions and, thus, solutions to these problems have long eluded those skilled in the art.

DISCLOSURE OF THE INVENTION

The present invention provides a semiconductor substrate having an insulator thereon with a semiconductor layer on the insulator. A deep trench isolation is formed, introducing strain to the semiconductor layer. A gate dielectric and a gate are formed on the semiconductor layer. A spacer is formed around the gate, and the semiconductor layer and the insulator are removed outside the spacer. Recessed source/drain are formed outside the spacer.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known device configurations and process steps are not disclosed in detail.

Likewise, the drawings showing embodiments of the device are semi-diagrammatic and not to scale and, particularly, some of the dimensions are for the clarity of presentation and may be shown greatly exaggerated in the FIGs.

The term "horizontal" as used herein is defined as a plane parallel to a substrate or wafer. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Figure 1:
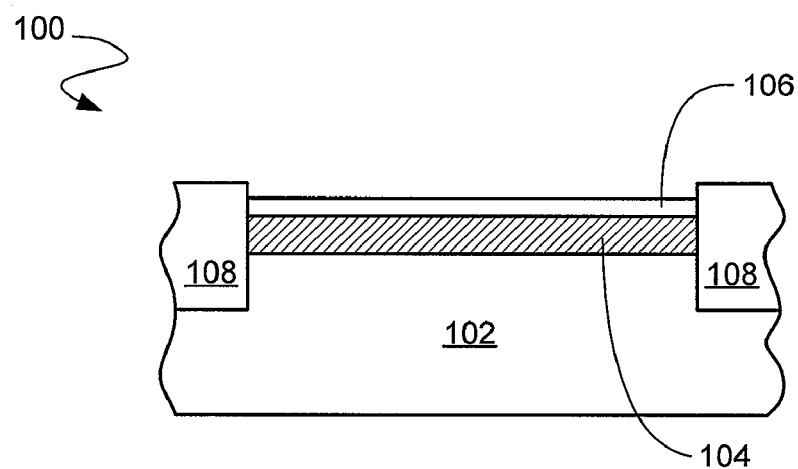
FIG. 1 is a cross-section of a fully depleted silicon on insulator semiconductor wafer.

Referring now to FIG. 1, therein is shown a cross-section of a fully depleted silicon on insulator ("FDSOI") wafer 100, which includes a semiconductor substrate 102 of a material such as a p-doped silicon ("Si"). On top of the semiconductor substrate 102 is a buried oxide layer ("BOX") 104, which is an insulator layer of a material such as silicon dioxide ("SiO$_2$"), and a channel layer 106 of a thin layer of Si.

In order to control short channel effects of 45 nm and below node with a 25 nm or smaller gate length, it has been discovered that the channel layer 106 must be thinner than 100 Å in thickness.

Figure 4:
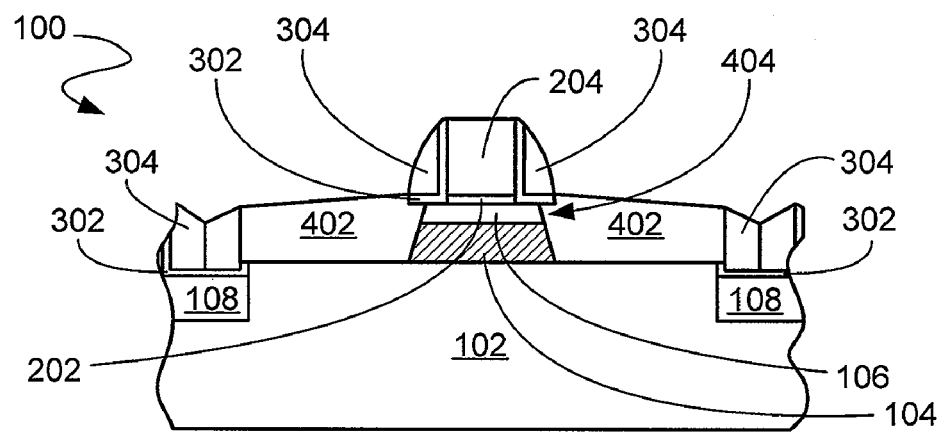
FIG. 4 shows the structure of FIG. 3 with recessed source/drain in accordance with an embodiment of the present invention.

A deep trench isolation ("DTI") 108, spaced outside recessed source/drain 402 (FIG. 4), has been added to the FDSOI wafer 100. The DTI 108 is formed with a deep trench etch that etches through the channel layer 106, the BOX 104, and into the substrate 102. To maintain device isolation, the depth of the DTI must be greater than the recessed source/drain 402 (FIG. 4). In order to complete the DTI 108, the resulting deep trench is filled with a dielectric of a material such as SiO$_2$.

Figure 2:
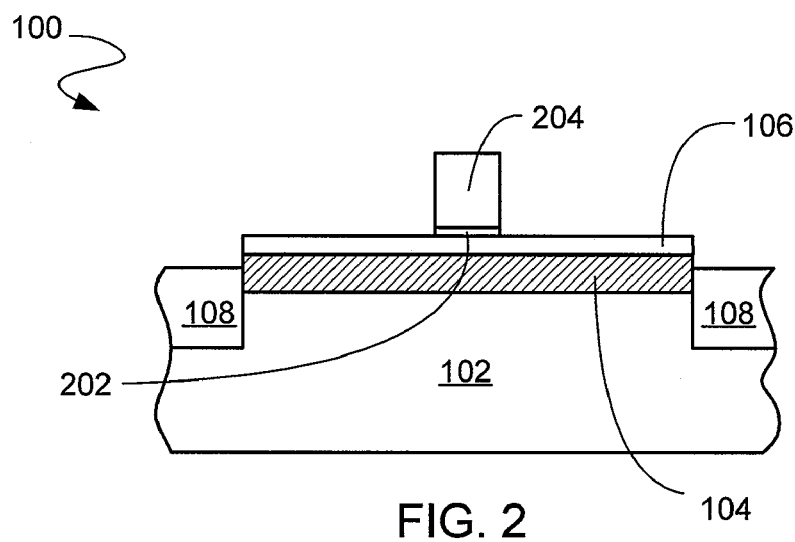
FIG. 2 shows the structure of FIG. 1 with a gate formed thereon.

Referring now to FIG. 2, therein is shown the structure of FIG. 1 after conventional deposition, patterning, photolithography, and etching to form a gate dielectric 202 of a material such as SiO$_2$, silicon oxynitride ("SiON"), or silicon nitride ("Si$_3$N$_4$"), and a gate 204 of a material such as polysilicon or amorphous silicon which can be either doped or undoped.

Figure 3:
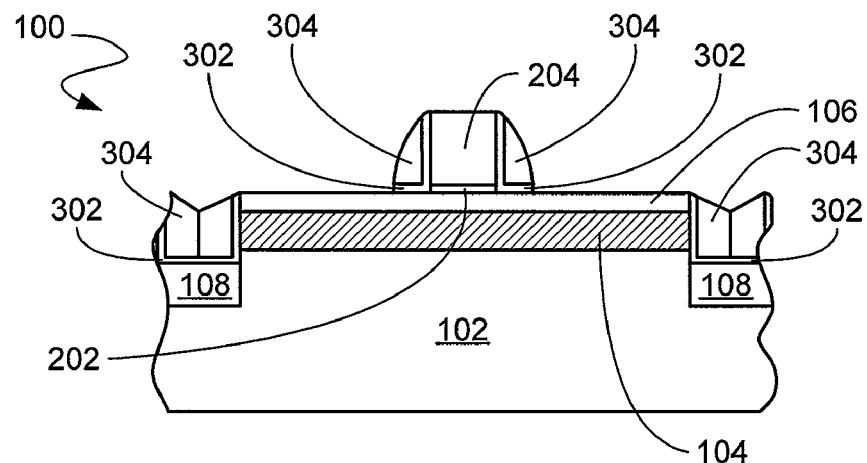
FIG. 3 shows the structure of FIG. 2 with a liner and spacer deposited thereon.

Referring now to FIG. 3, therein is shown the structure of FIG. 2 after further processing. A recess etch of the DTI 108 prepares the wafer 100 for spacer formation in the DTI 108. A liner 302 of a material such as SiO$_2$ is deposited on the gate 204, the channel layer 106, and the DTI 108. A spacer 304 of a material such as Si$_3$N$_4$ is formed around the gate portion of the liner 302 and in the DTI 108.

Among the key issues for fabrication of FDSOI CMOS is the formation of source and drain with low parasitic series resistance. One solution has been to elevate the source and drain. Elevated source and drain can be formed by selective epitaxial growth ("SEG"). Unfortunately, it is difficult to uniformly grow high quality, single crystalline source and drain on an extremely thin silicon island such as the channel layer 106. Furthermore, processes performed prior to SEG, such as oxidation, pre-clean, and H$_2$ baking, can remove all or parts of the thin silicon needed for SEG.

Referring now to FIG. 4, therein is shown the structure of FIG. 3 after processing in accordance with an embodiment of the present invention. Recessed source/drain 402 have been added to the FDSOI wafer 100. The channel layer 106 has been etched to form a channel 404.

To form the recessed source/drain 402, a suitable process, such as etching, is used to penetrate through the channel layer 106 and the BOX 104 between the gate 204 and the DTI 108. It has been discovered that a thin BOX 104 from 100Å-600Å provides an optimal thickness. Selective epitaxial growth ("SEG") then takes place on the surface of the substrate 102 and the sidewall of the channel 404. This ensures a continuous, high quality Si surface for the SEG of the recessed source/drain 402 even when silicon of the channel layer 106 may be partially or even entirely consumed by previous processes.

The resulting structure retains the advantages of elevated source and drain, such as low parasitic series resistance, while overcoming the problem of SEG on thin silicon. At this stage, performance can be improved through modification of the SEG of the recessed source/drain 402.

Figure 5:
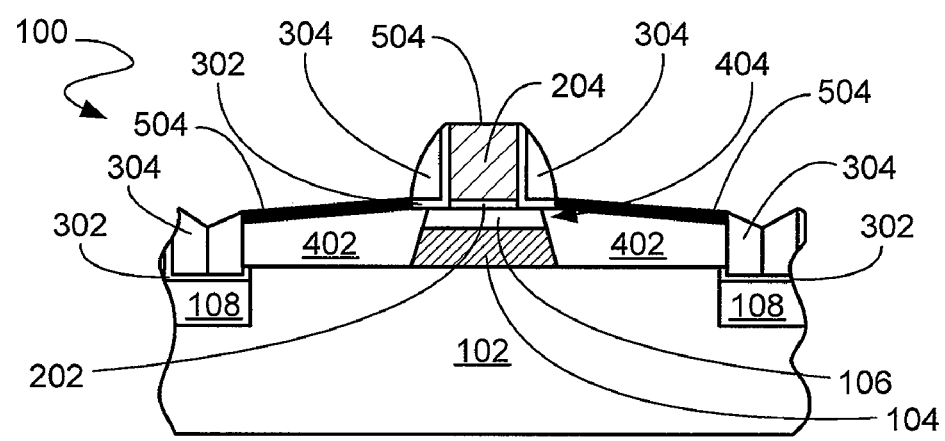
FIG. 5 shows the structure of FIG. 4 after silicidation in accordance with an embodiment of the present invention.

Referring now to FIG. 5, therein is shown the structure of FIG. 4 after further processing in accordance with an embodiment of the present invention. Silicidation takes place on the gate 204 and the source/drain 402 to form a NiSi layer 504.

It will be understood that the order of forming the recessed source/drain 402 and the DTI 108 is optional and the sequence described above has been done so as a matter of convenience. The recessed source/drain 402 can be formed in situ during selective epitaxial growth of the recessed source/drain 402 or by ion implantation and rapid thermal anneal. Through strain engineered trench fill dielectrics, the DTI 108 introduces strain to the channel 404 and is preferred for isolation among transistors.

Introducing tensile strain or compressive strain to the channels of FDSOI CMOS devices improves performance. Tensile strain along the direction of current flow increases both electron and hole mobility in an NMOS. On the other hand compressive strain improves performance of a PMOS by increasing hole mobility. Thus, applied strain as appropriate to the channel 404 significantly increases channel mobility, consequently increasing drive current by a significant fraction of the mobility gain.

It has been discovered that strain can be further improved in FDSOI PMOS transistors by selective epitaxial growth of silicon germanium (SiGe). Thus, the SiGe of the recessed source/drain 402 effectively induce strain in the channel 404 of a FDSOI PMOS transistor. The strain is also more effective because the recessed source/drain 402 are immediately adjacent the channel 404 and allow more strain to be introduced than can be introduced in raised source/drain.

Furthermore, it has been discovered that strain can be further improved in FDSOI NMOS transistors by selective epitaxial growth of silicon carbide (SiC). Thus, SiC of the recessed source/drain effectively induce strain in the channel 404 of a FDSOI NMOS transistor. The strain is also more effective because the recessed source/drain 402 are immediately adjacent the channel 404 and more strain can be introduced than can be introduced in raised source/drain.

The above strain control can be implemented as an adjunct to the strain control from the DTI 108 or as the primary control where the DTI 108 is formed before the recessed source/drain 402.

Figure 6:
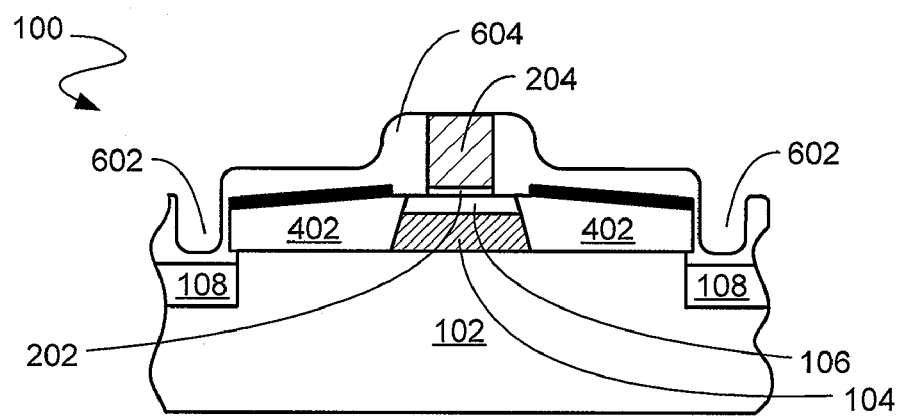
FIG. 6 shows the structure of FIG. 5 with a contact etch stop layer in accordance with an alternate embodiment of the present invention.

Referring now to FIG. 6, therein is shown the structure of FIG. 5 after further processing in accordance with an alternate embodiment of the present invention. An etch has removed the spacer 304 (FIG. 5) and the dielectric fill of the DTI 108 (FIG. 5), leaving a trench 602. After the etch, a contact etch stop layer 604 is deposited in the trench 602 and over the source/drain 402, the liner 302, and the gate 204. The contact etch stop layer 604 in the trench 602 introduces additional strain to the channel 404.

Figure 7:
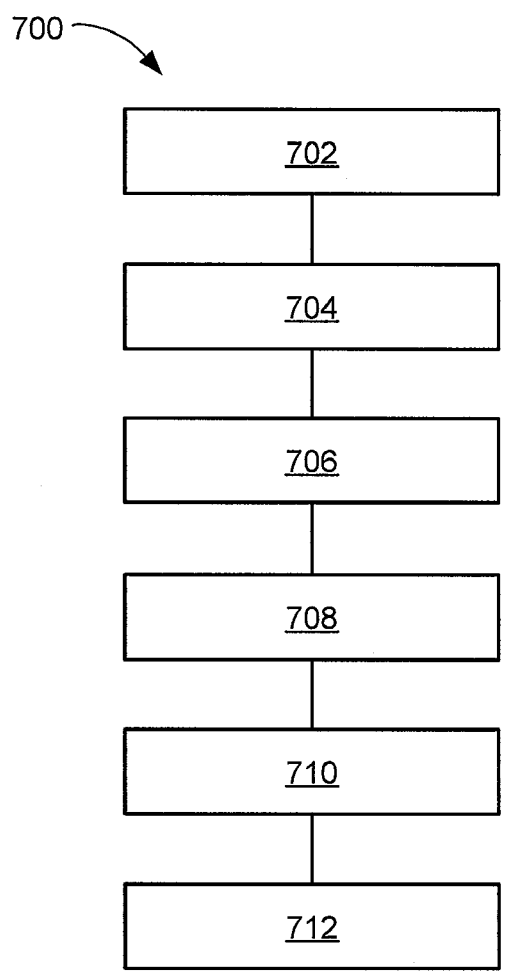
FIG. 7 is a flow chart of a method for manufacturing a strained fully depleted silicon on insulator semiconductor device in accordance with the present invention.

Referring now to FIG. 7, therein is shown a flow chart of a method 700 for manufacturing a strained fully depleted silicon on insulator semiconductor device in accordance with the present invention. The method 700 includes providing a semiconductor substrate having an insulator thereon with a semiconductor layer on the insulator in a block 702; forming a gate dielectric and a gate on the semiconductor layer in a block 704; forming a deep trench isolation spaced outside the spacer and introducing strain to the semiconductor layer in a block 706; forming a spacer around the gate in a block 708; removing the semiconductor layer and the insulator outside the spacer in a block 710; and forming recessed source/drain outside the spacer in a block 712.

Thus, it has been discovered that the semiconductor device method and apparatus of the present invention furnish important and heretofore unknown and unavailable solutions, capabilities, and functional advantages for FDSOI CMOS. The resulting process and configurations are straightforward, economical, uncomplicated, highly versatile, accurate, sensitive, and effective, and can be implemented by adapting known components for ready manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for manufacturing a semiconductor device comprising:
    providing a semiconductor substrate having an insulator thereon with a semiconductor layer on the insulator;
    forming a deep trench isolation, introducing strain to the semiconductor layer;
    forming a gate dielectric and a gate on the semiconductor layer;
    forming a spacer around the gate;
    removing the semiconductor layer and the insulator outside the spacer;
    forming recessed source/drain outside the spacer;
    removing the spacer;
    removing the deep trench isolation, leaving a trench; and
    depositing a layer in the trench, over the recessed source/drain, and over the gate, introducing strain to the semiconductor layer.

2. The method of claim 1 wherein forming recessed source/drain outside the spacer further comprises forming recessed source/drain by selective epitaxial growth outside the spacer.

3. The method of claim 1 wherein forming recessed source/drain outside the spacer further comprises forming recessed carbon doped silicon source/drain outside the spacer, introducing strain to the semiconductor layer.

4. The method of claim 1 wherein forming recessed source/drain outside the spacer further comprises forming recessed silicon germanium source/drain outside the spacer, introducing strain to the semiconductor layer.

5. A method for manufacturing a semiconductor device comprising:
    providing a silicon substrate having a buried oxide layer insulator thereon and a silicon layer on the insulator;
    forming a deep trench isolation, introducing strain to the silicon layer;
    forming a gate dielectric and a gate on the silicon layer;
    forming a liner around the gate and on the silicon layer;
    forming a spacer on the liner around the gate;
    removing the silicon layer, and the insulator to expose the surface of the silicon substrate outside the spacer;
    forming recessed source/drain through selective epitaxial growth outside the spacer;
    removing the spacer;
    removing the deep trench isolation, leaving a trench; and
    depositing a contact etch stop layer in the trench and over the recessed source/drain, the liner, and the gate, introducing strain to the silicon layer.

6. The method of claim 5 wherein forming recessed source/drain through selective epitaxial growth outside the spacer further comprises forming recessed source/drain through selective epitaxial growth on the surface of the silicon substrate outside the spacer.

7. The method of claim 5 wherein forming recessed source/drain through selective epitaxial growth outside the spacer further comprises forming recessed carbon doped silicon source/drain through selective epitaxial growth outside the spacer, introducing strain to the silicon layer.

8. The method of claim 5 wherein forming recessed source/drain through selective epitaxial growth outside the spacer further comprises forming recessed silicon germanium source/drain through selective epitaxial growth outside the spacer, introducing strain to the silicon layer.

* * * * *